US010658459B2

(12) United States Patent
Chao et al.

(10) Patent No.: US 10,658,459 B2
(45) Date of Patent: May 19, 2020

(54) NANOSHEET TRANSISTOR WITH ROBUST SOURCE/DRAIN ISOLATION FROM SUBSTRATE

(71) Applicant: International Business Machines Corporation, Armonk, NY (US)

(72) Inventors: Robin Hsin Kuo Chao, Cohoes, NY (US); Kangguo Cheng, Schenectady, NY (US); Cheng Chi, Jersey City, NJ (US); Ruilong Xie, Yorktown Heights, NY (US); John H. Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/545,867

(22) Filed: Aug. 20, 2019

(65) Prior Publication Data
US 2020/0006476 A1    Jan. 2, 2020

Related U.S. Application Data

(62) Division of application No. 15/967,524, filed on Apr. 30, 2018, now Pat. No. 10,431,651.

(51) Int. Cl.
*H01L 29/06* (2006.01)
*H01L 29/775* (2006.01)
*H01L 29/66* (2006.01)

(52) U.S. Cl.
CPC ...... *H01L 29/0653* (2013.01); *H01L 29/0669* (2013.01); *H01L 29/66439* (2013.01); *H01L 29/775* (2013.01)

(58) Field of Classification Search
None
See application file for complete search history.

(56) References Cited

U.S. PATENT DOCUMENTS

| 9,691,851 B1 * | 6/2017 | Fung | H01L 29/0684 |
| 9,984,936 B1 * | 5/2018 | Xie | H01L 29/775 |
| 2018/0033871 A1 * | 2/2018 | Xie | H01L 29/66795 |

OTHER PUBLICATIONS

List of all IBM related dockets. Appendix P. 2019.

\* cited by examiner

*Primary Examiner* — Mounir S Amer
(74) *Attorney, Agent, or Firm* — Garg Law Firm, PLLC; Rakesh Garg; Joseph Petrokaitis

(57) ABSTRACT

A substrate structure for a nanosheet transistor includes a plurality of nanosheet layers and a plurality of recesses between the nanosheet layers. The substrate structure includes at least one trench through portions of the nanosheet layers, the sacrificial layers, and the substrate. The substrate structure includes a u-shaped portion formed at a bottom portion of the at least one trench. The u-shaped portion includes a bottom cavity. The substrate structure further includes a first liner disposed upon the u-shaped portion of the at least one trench, and a second liner disposed on the first liner. The substrate structure further includes a third liner disposed within the at least one trench to fill the bottom cavity of the u-shaped portion to form a bottom inner spacer within the bottom cavity.

6 Claims, 12 Drawing Sheets

NANOSHEET TRANSISTOR WITH ROBUST SOURCE/DRAIN ISOLATION FROM SUBSTRATE

TECHNICAL FIELD

The present invention relates generally to a method, system, and computer program product for fabricating nanosheet transistors. More particularly, the present invention relates to a method, system, and computer program product for fabricating nanosheet transistors with robust source/drain isolation from a substrate.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Many semiconductor devices are planar, i.e., where the semiconductor structures are fabricated on one plane. A non-planar device is a three-dimensional (3D) device where some of the structures are formed above or below a given plane of fabrication.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Nanosheet transistor devices are becoming increasingly pursed as a viable semiconductor device option, especially for transistors at smaller scales. A nanosheet FET transistor typically includes a substrate, a number of vertically stacked nanosheets forming a channel, and a gate. A nanosheet is formed of a thin layer of semiconductor channel material having a vertical thickness that is less than a width of the material.

SUMMARY

The illustrative embodiments provide a method and an apparatus formed by the method. An embodiment of a method includes receiving a substrate structure having a plurality of nanosheet layers and a plurality of sacrificial layers stacked upon a substrate. The embodiment further includes forming at least one trench through portions of the nanosheet layers, the sacrificial layers, and the substrate. The embodiment further includes depositing a first liner within the at least one trench, and depositing a second liner on the first liner. The embodiment further includes selectively removing portions of the second liner to form a u-shaped portion at a bottom portion of the at least one trench. In the embodiment, the u-shaped portion includes a bottom cavity. The embodiment further includes selectively removing portions of the first liner to a level of a top portion of the u-shaped portion at the bottom portion of the at least one trench. The embodiment further includes selectively laterally etching edges of each of the sacrificial layers to create recesses within the sacrificial layers. The embodiment further includes depositing a third liner within the at least one trench to fill the recesses and the bottom cavity of the u-shaped portion.

An embodiment further includes etching the third liner to form side inner spacers adjacent to the sacrificial layers and a bottom inner spacer within the bottom cavity. An embodiment further includes depositing a source/drain epitaxy upon the bottom inner spacer. An embodiment further includes removing portions of the sacrificial layers, and depositing a gate material within voids left by removal of the sacrificial layers. In an embodiment, the gate material includes a high-K metallic gate (HKMG) material.

An embodiment further includes forming a dummy gate upon a top nanosheet layer of the plurality of nanosheet layers. An embodiment further includes removing portions of the dummy gate, and depositing a gate material within a void left by removal of the dummy gate. An embodiment further includes forming an insulative cap upon the gate material, depositing an interlayer dielectric layer upon the insulative cap, and forming contacts within the interlayer dielectric layer and the insulative cap in contact with the source/drain epitaxy.

An embodiment further includes depositing, prior to selectively removing the second liner, an organic planarizing layer (OPL) within the at least one trench, and removing the OPL prior to the selective lateral etching of edges of each of the sacrificial layers.

In an embodiment, the first liner is formed of an oxide material. In an embodiment, the second liner is formed of a nitride material. In an embodiment, the third liner is formed of a nitride material. In an embodiment, the first liner is thinner than the second liner.

In an embodiment, the nanosheet layers are formed of a silicon (Si) material. In an embodiment, the sacrificial layers are formed of a silicon-germanium (SiGe) material.

An embodiment of an apparatus includes a substrate structure having a plurality of nanosheet layers and a plurality of recesses between the nanosheet layers. In the embodiment, the substrate structure includes at least one trench through portions of the nanosheet layers, the sacrificial layers, and the substrate. The embodiment further includes a u-shaped portion formed at a bottom portion of the at least one trench. In the embodiment, the u-shaped portion includes a bottom cavity. The embodiment further includes a first liner disposed upon the u-shaped portion of the at least one trench, and a second liner disposed on the first liner. The embodiment further includes a third liner disposed within the at least one trench to fill the bottom cavity of the u-shaped portion to form a bottom inner spacer within the bottom cavity.

An embodiment further includes a plurality of recesses disposed between the nanosheet layers, wherein the third liner is further disposed within the plurality of recesses to form a plurality of inner spacers between the nanosheet layers. An embodiment further includes a source/drain epitaxy disposed upon the bottom inner spacer.

An embodiment further includes a gate material disposed between the nanosheet layers. An embodiment further includes an insulative cap disposed upon a top nanosheet of the plurality of nanosheets, an interlayer dielectric layer disposed upon the insulative cap, and at least one contact formed within the interlayer dielectric layer and the insulative cap in contact with the source/drain epitaxy.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
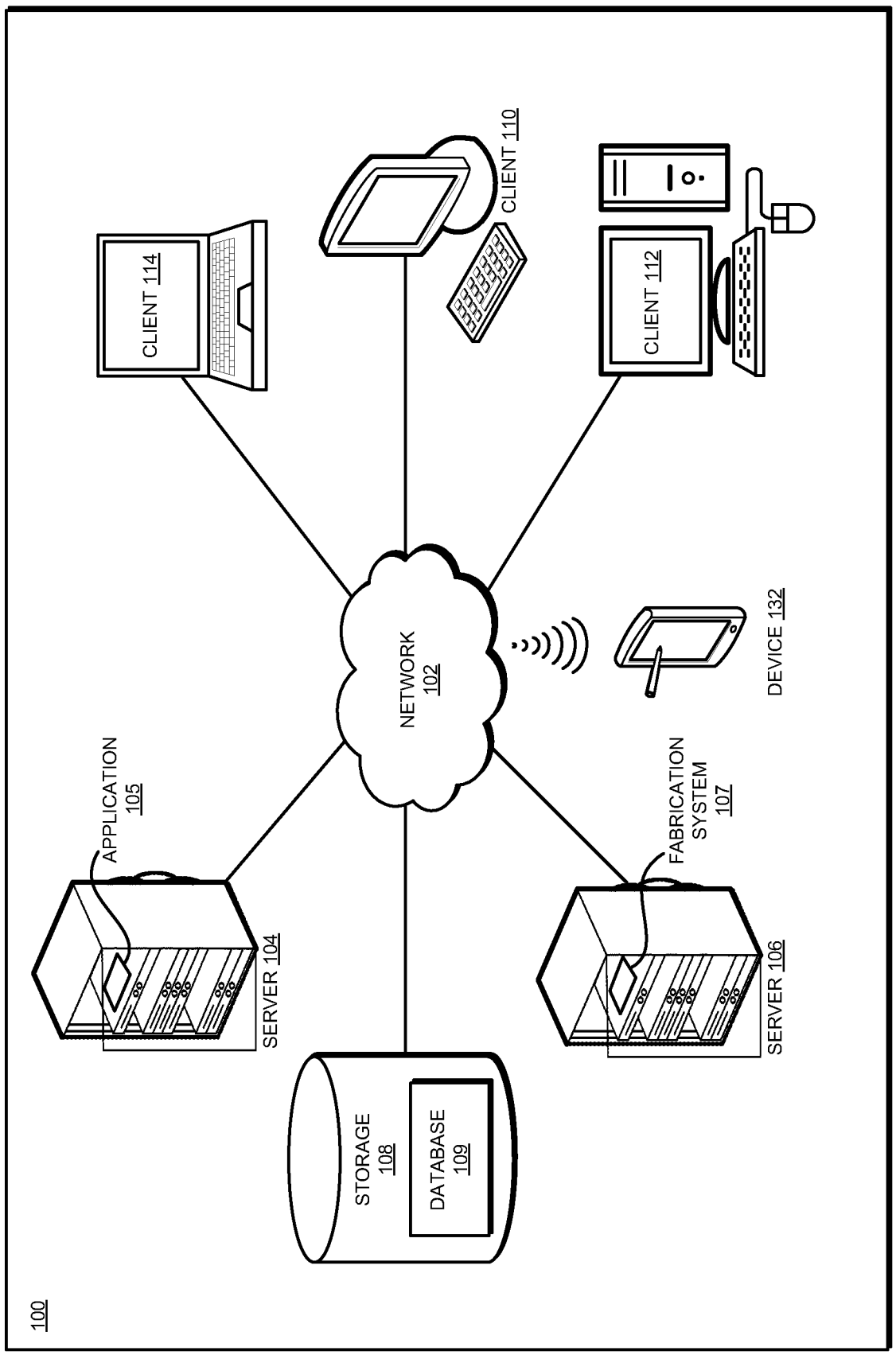
FIG. 1 depicts a block diagram of a network of data processing systems in which illustrative embodiments may be implemented.

The illustrative embodiments relate to a method, system, and computer program product for fabricating a nanosheet transistor with robust source/drain isolation from a substrate. The illustrative embodiments recognize that the present methods and techniques for fabricating nanosheet transistors suffer from several problems. For example, existing nanosheet transistors often exhibit current leakage from the source/drain (S/D) region to the substrate. Punch-through stop (PTS) implantation of dopants is not sufficient to properly isolate the S/D epitaxy from the bulk substrate. Certain embodiments used to describe the invention generally address and solve one or more of the above-described problems and other problems related to fabricating nanosheet transistors.

Various embodiments provide for forming nanosheet transistors in which the S/D epitaxy is isolated from the substrate to reduce current leakage from the S/D region to the substrate. In one or more embodiments, a process is provided in which a liner, such as a nitride liner, is deposited and chamfered during nanosheet device fabrication to prevent connection between the S/D and the substrate of the nanosheet device. In a particular embodiment, a nitride liner is chamfered to reduce source/drain bottom trench critical dimensions, followed by formation of an inner spacer to fully pinch-off the space to prevent epitaxy growth from the bottom. In the particular embodiment, an organic planarization layer (OPL) is deposited to control the chamfer level during fabrication of the nanosheet device to result in a unique bottom high-k metal gate (HKMG) shape and isolation structure.

A particular embodiment of a process for fabricating a nanosheet transistor with robust source/drain isolation from a substrate includes depositing conformal dielectric liners of silicon dioxide ($SiO_2$) and silicon nitride (SiN), respectively, on a product wafer including stacked nanosheet layers of silicon (Si) and sacrificial layers of silicon-germanium (SiGe). In the embodiment, an OPL is deposited by spin coating, followed by a controlled wet chemical etching of the OPL to a desired level, below a bottom nanosheet channel level. In the embodiment, the product wafer is then subjected to a selective wet etch that removes the SiN liner followed by the $SiO_2$ liner to form a chamfering, or cutting away, of the liners. Due to the existence of the remaining OPL, a vertical removal (chamfering) level is controlled to be at the same level as the OPL.

In the embodiment, the OPL is stripped and sacrificial layers of SiGe disposed between the nanosheet layers are partially laterally etched. In the embodiment, another SiN liner is deposited in which a bottom cavity is fully pinchedoff, and the SiN liner is etched back exposing the Si channel side wall to form inner spacers. In the embodiment, epitaxial growth of the source/drain is performed, and the sacrificial layers are removed. In the embodiment, HKMG material is deposited and S/D contacts are formed.

In one or more embodiments, nitride liner chamfering to reduce source/drain bottom trench critical dimensions, followed by inner spacer deposition to fully pinch-off the inner spacer space to prevent Si epitaxy growth from the bottom, disconnects the electron path between the source/drain and the substrate. In one or more embodiments, a horizontal nanosheet device is provided having a unique multi-layer dielectric liner structure at the bottom of the S/D region that prevents current flow in the horizontal nanosheet device from the S/D and the substrate while also provided a unique shape in the bottom HKMG in which a lower portion is wider than an upper portion.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate nanosheet transistors.

For the clarity of the description, and without implying any limitation thereto, the illustrative embodiments are described using nanosheet transistor structures disposed on a substrate. An embodiment can be implemented with different types and/or numbers of nanosheet transistors, a different number of gates, and/or a different number of substrates within the scope of the illustrative embodiments.

Furthermore, a simplified diagram of the example nanosheet transistors are used in the figures and the illustrative embodiments. In an actual fabrication of a nanosheet transistor, additional structures that are not shown or described herein may be present without departing the scope of the illustrative embodiments. Similarly, within the scope of the illustrative embodiments, a shown or described structure in the example nanosheet transistors may be fabricated differently to yield a similar operation or result as described herein.

Differently shaded portions in the two-dimensional drawing of the example nanosheet transistors are intended to represent different structures in the example nanosheet transistors, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating nanosheet transistors according to the illustrative embodiments.

Furthermore, the illustrative embodiments are described with respect to nanosheet transistors only as an example. The steps described by the various illustrative embodiments can be adapted for fabricating other planar and non-planar devices employing nanosheets in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating nanosheet transistor devices. An embodiment provides a method for fabricating nanosheet transistors with robust source/drain isolation from a substrate.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
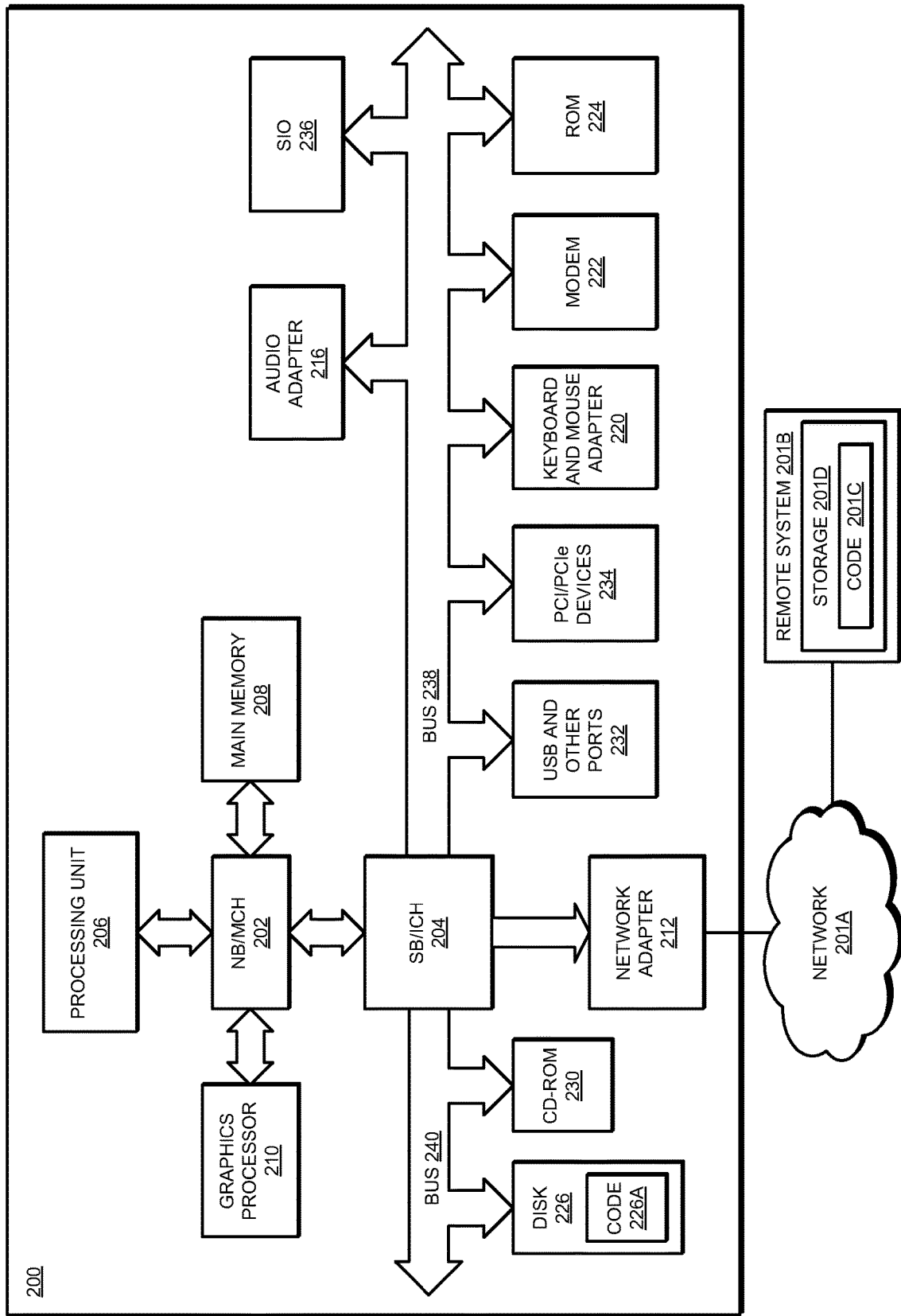
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more nanosheet transistors in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service-oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. In another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

With reference to FIGS. 3-11, these figures depict an example process for fabricating nanosheet transistors with robust source/drain isolation from a substrate in accordance with one or more illustrative embodiments. In the particular embodiments illustrated in FIGS. 3-11, a three fin nanosheet transistor structure is fabricated upon a substrate and/or wafer. It should be understood that in other embodiments, any combination of fins or other combinations of any numbers of nanosheet semiconductor devices, may be fabricated on a substrate in a similar manner.

Figure 3:
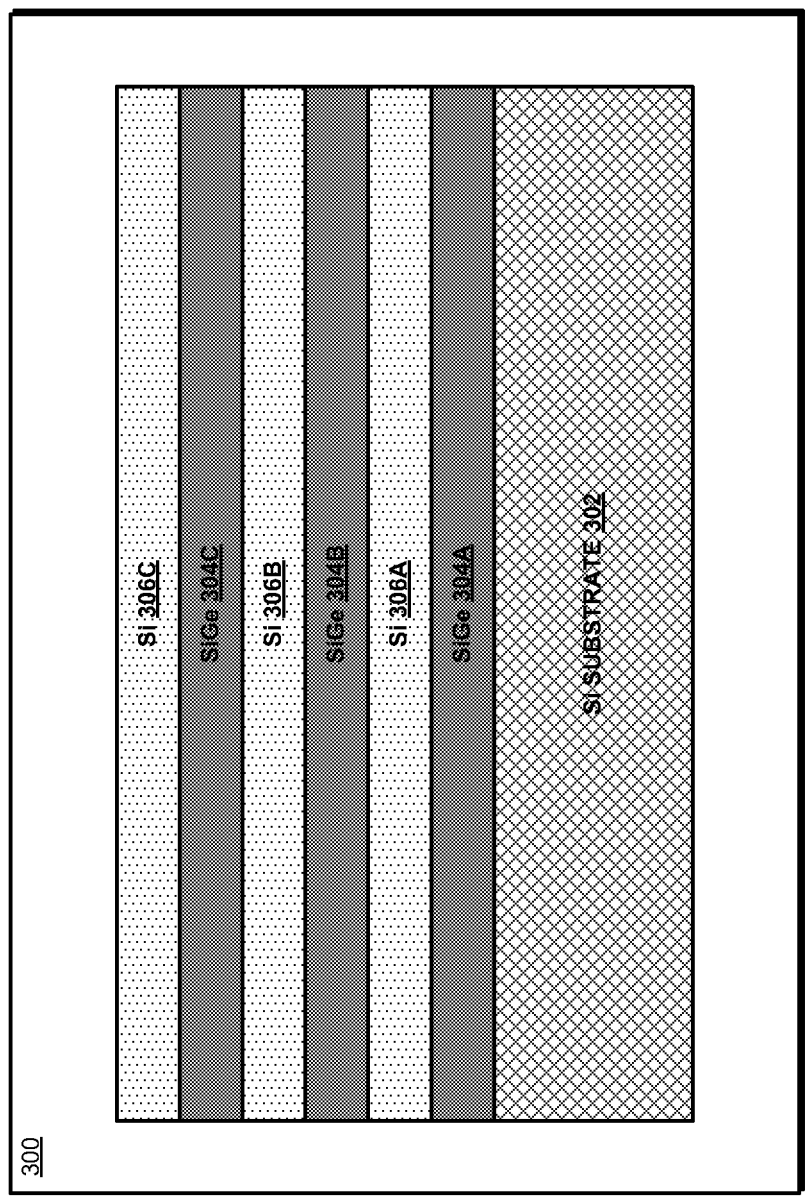
FIG. 3 depicts a portion of a process according to an illustrative embodiment.

With reference to FIG. 3, this figure depicts a portion of a process in which an example substrate structure 300 is received according to an illustrative embodiment. Application 105 in FIG. 1 interacts with fabrication system 107 to produce or manipulate substrate structure 300 as described herein.

Substrate structure 300 includes a substrate layer 302, a first silicon-germanium (SiGe) layer 304A formed on substrate layer 302, a first silicon (Si) layer 306A formed on first SiGe layer 304A, a second SiGe layer 304B formed on first Si layer 306A, a second Si layer 306B formed on second SiGe layer 304B, a third SiGe layer 304C formed on second Si layer 306B, and a third Si layer 306C formed on third SiGe layer 304C. In one or more embodiments, substrate 302 is formed of a silicon (Si) material. SiGe layers 304A-304C function as sacrificial layers that are substantially removed during subsequent portions of the process. In other embodiments, other suitable sacrificial layer materials may be used instead of or in addition to SiGe layers 304A-304C. Si layers 306A-306C function as nanosheet layers of the nanosheet transistors. In other embodiments, other suitable nanosheet layer materials may be used instead of or in addition to Si layers 306A-306C. Although the embodiment illustrated in FIG. 3 is shown as including three sacrificial layers and three nanosheet layers, it should be understood that in other embodiments any number of sacrificial layers and nanosheet layers may be used. Further, in the embodiment illustrated in FIG. 3 SiGe layers 304A-304C are shown as being of equal thickness. In a particular embodiment, first SiGe layer 304A may be of a greater thickness than second SiGe layer 304B and third SiGe layer 304C.

Figure 4:
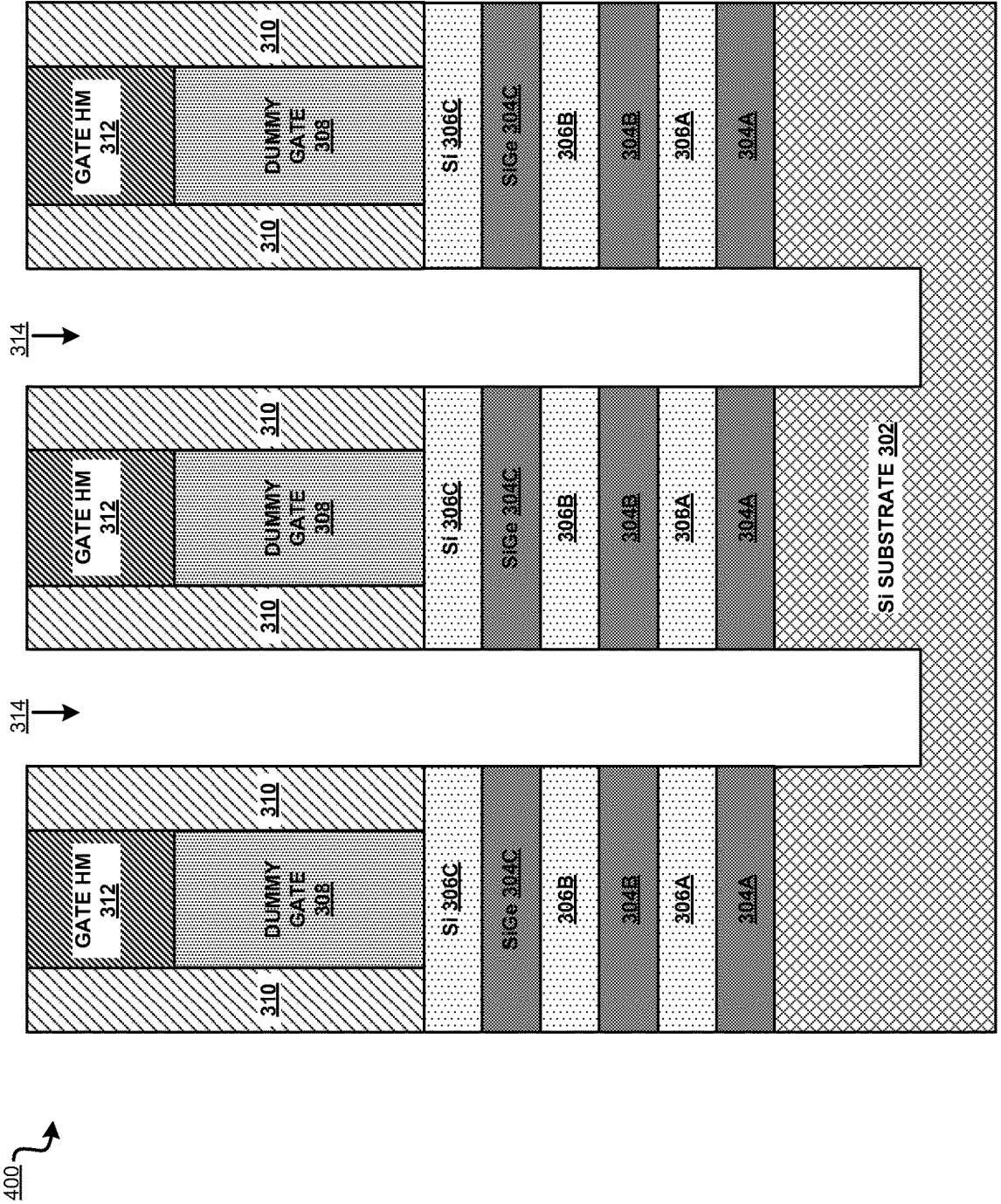
FIG. 4 depicts another portion of a process according to an illustrative embodiment.

With reference to FIG. 4, FIG. 4 depicts another portion of a process in which a structure 400 is formed according to an embodiment. In one or more embodiments, fabrication system 107 forms three dummy gates 308 upon third Si layer 306C. In an embodiment, dummy gates are also formed on the sidewalls of the nanosheet stack although it is not visible in the cross-sectional view of FIG. 4. In the illustrated embodiment, dummy gates 308 extend vertically from an upper surface of third Si layer 306C. In one or more embodiments, dummy gates 308 function as placeholders that are removed and replaced with suitable gate materials to form gates during subsequent portions of the fabrication process as further described herein. In particular embodiments, dummy gates 308 are formed of a silicon oxide layer (not shown) on top and sidewalls of the nanosheet stack and an amorphous silicon on top of silicon oxide. In one or more embodiments, dummy gates 308 are formed by one or more deposition processes. In the embodiment, fabrication system 107 forms gate hard mask layer 312 on dummy gates 308. In a particular embodiment, fabrication system 107 forms gate hard mask layer 312 on top of the silicon oxide and gate hard mask layer 312 and a dummy gate layer, and gate hard mask layer 312 and the dummy gate layer are patterned to form hard mask layer 312 and dummy gates 308.

In the embodiment, fabrication system 107 further forms spacer layer 310 around sides of each of dummy gates 308 and around each side of gate hard mask 312. In a particular embodiment, spacer layer 310 is formed by deposition followed by a reactive-ion etching (RIE) process. In a particular embodiment, gate hard mask 312 is formed of a siliconborocarbonitride (SiBCN) material. In the embodiment, fabrication system 107 etches through portions of spacer layer 310, third Si layer 306C, third SiGe layer 304C, second Si layer 306B, second SiGe layer 304B, first Si layer 306A, first SiGe layer 304A, and substrate 302 to form two vertical trenches 314 adjacent to and between dummy gates 308 thereby forming three fins of the structure 400.

Figure 5:
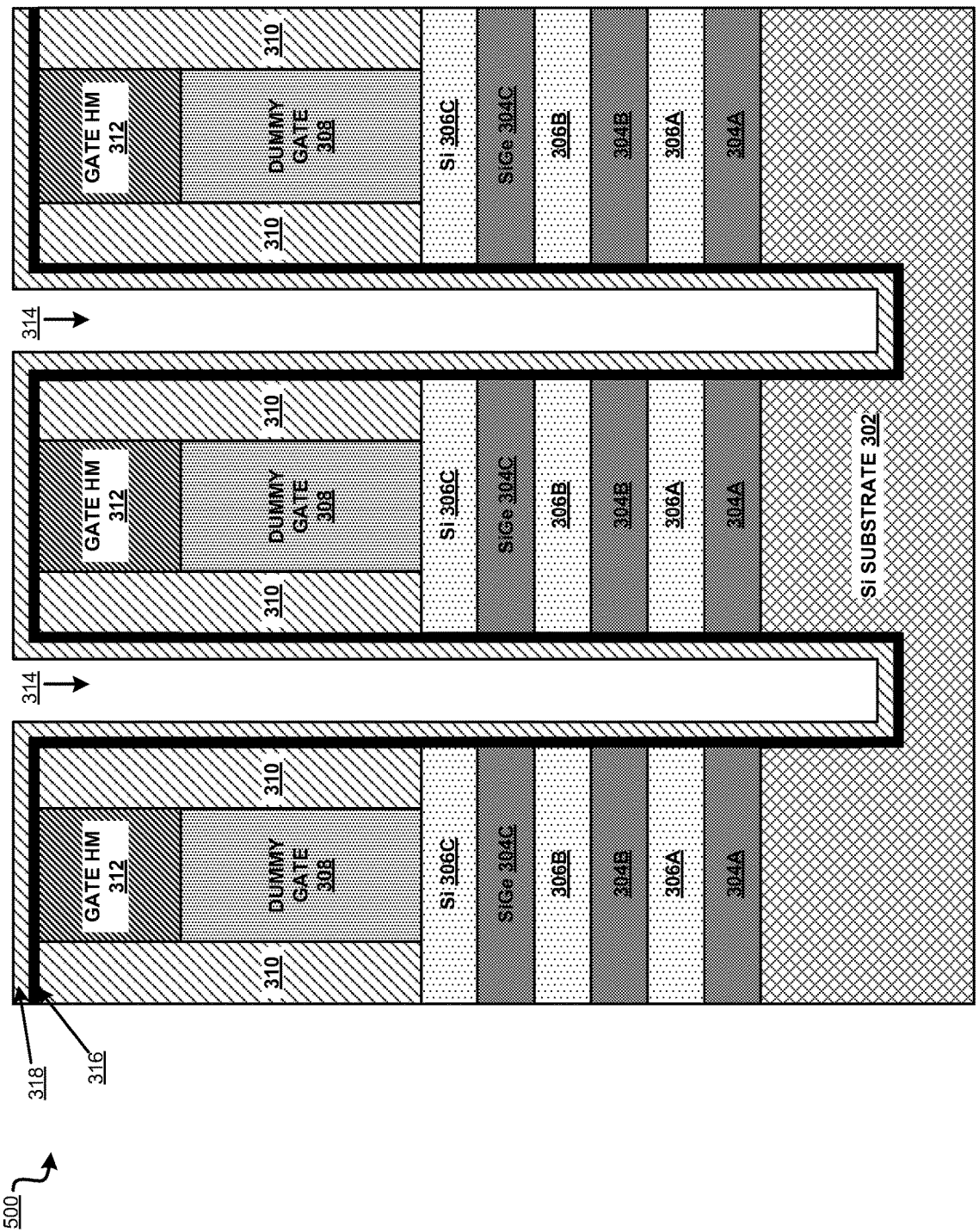
FIG. 5 depicts another portion of a process according to an illustrative embodiment.

With reference to FIG. 5, FIG. 5 depicts another portion of a process in which structure 500 is formed according to an embodiment. In the embodiment, fabrication system 107 deposits a first conformal dielectric liner 316 on gate hard mask 312 and within trenches 314. In one or more embodiments, first conformal dielectric liner 316 is formed of an oxide such as $SiO_2$. In the embodiment, fabrication system 107 deposits a second conformal dielectric liner 318 on first conformal dielectric liner 316. In one or more embodiments, second conformal dielectric liner 318 is formed of SiN. In a particular embodiment, first conformal dielectric liner 316 is thinner than second conformal dielectric liner 318. In a particular embodiment, non-limiting exemplary thicknesses are 2-4 nm for first conformal dielectric liner 316, and 4-8 nm for second conformal dielectric liner 318. Exemplary non-limiting deposition techniques for first conformal dielectric liner 316 and second conformal dielectric liner 318 include atomic layer deposition (ALD), molecular layer deposition (MLD), chemical vapor deposition (CVD), low-pressure chemical vapor deposition (LPCVD), plasma enhanced chemical vapor deposition (PECVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, and limited reaction processing CVD (LRPCVD).

Figure 6:
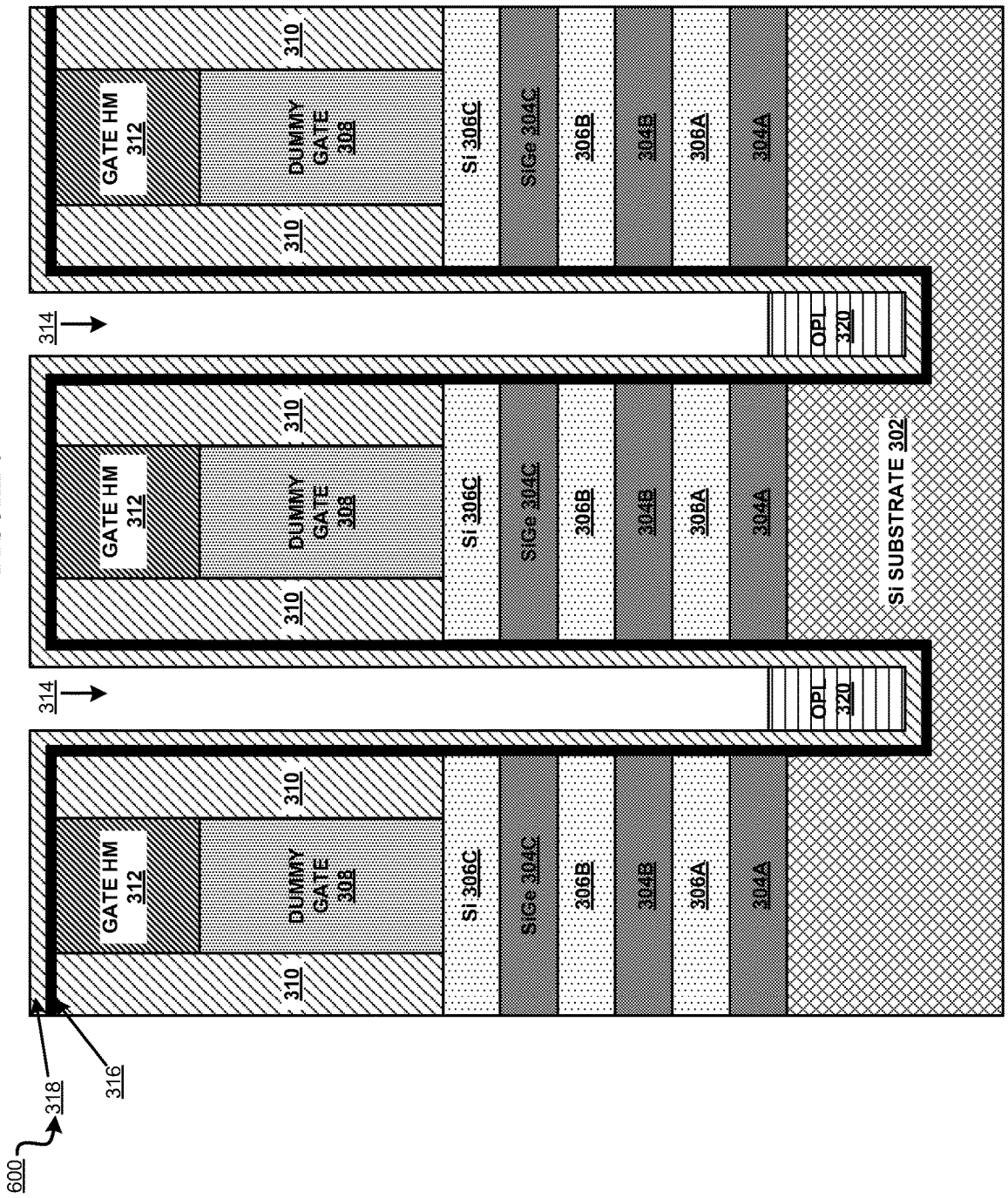
FIG. 6 depicts another portion of a process according to an illustrative embodiment.

With reference to FIG. 6, FIG. 6 depicts another portion of a process in which a structure 600 is formed according to an embodiment. In one or more embodiments, fabrication system 107 deposits an organic planarizing layer (OPL) 320 within trenches 314 and recesses OPL 320 to a level below first Si layer 306A and between a top surface and bottom surface of first SiGe layer 304A. In a particular embodiment, fabrication system 107 deposits OPL 320 by a spin coating process, and etches OPL 320 using a controlled plasma etch.

Figure 7:
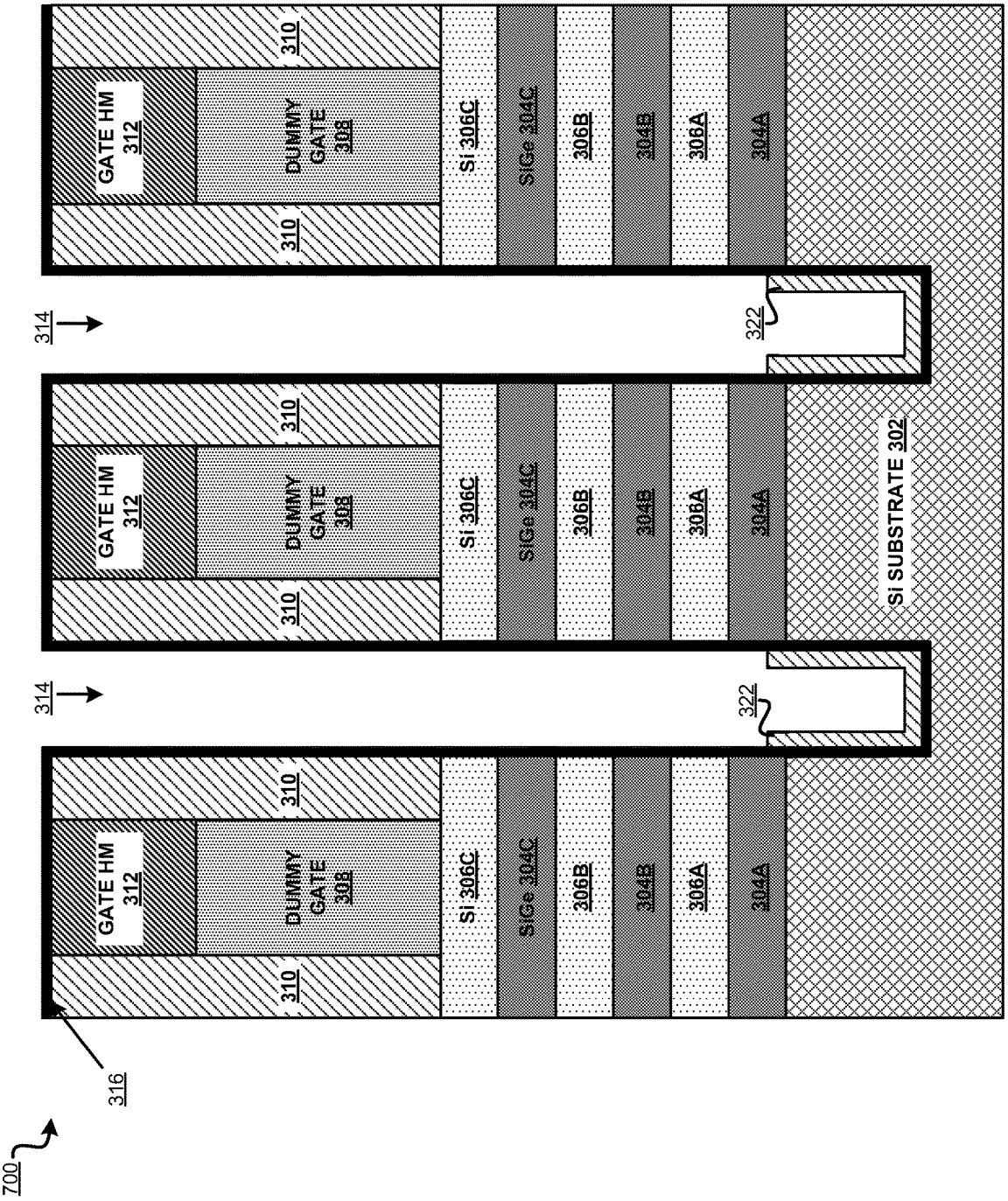
FIG. 7 depicts another portion of a process according to an illustrative embodiment.

With reference to FIG. 7, FIG. 7 depicts another portion of a process in which a structure 700 is formed according to an embodiment. In the embodiment, fabrication system 107 selectively removes portions of second conformal dielectric liner 318 to form chamfered portion 322 at the bottom of trench 314. In a particular embodiment, fabrication system 107 selectively removes portions of second conformal dielectric liner 318 using a selective wet etching process. In the embodiment, first dielectric liner 316 protects the nanosheet, dummy gate 308, and spacers 310 during the selective etching of the second dielectric liner 318. In the embodiment, fabrication system 107 further strips OPL 320.

Figure 8:
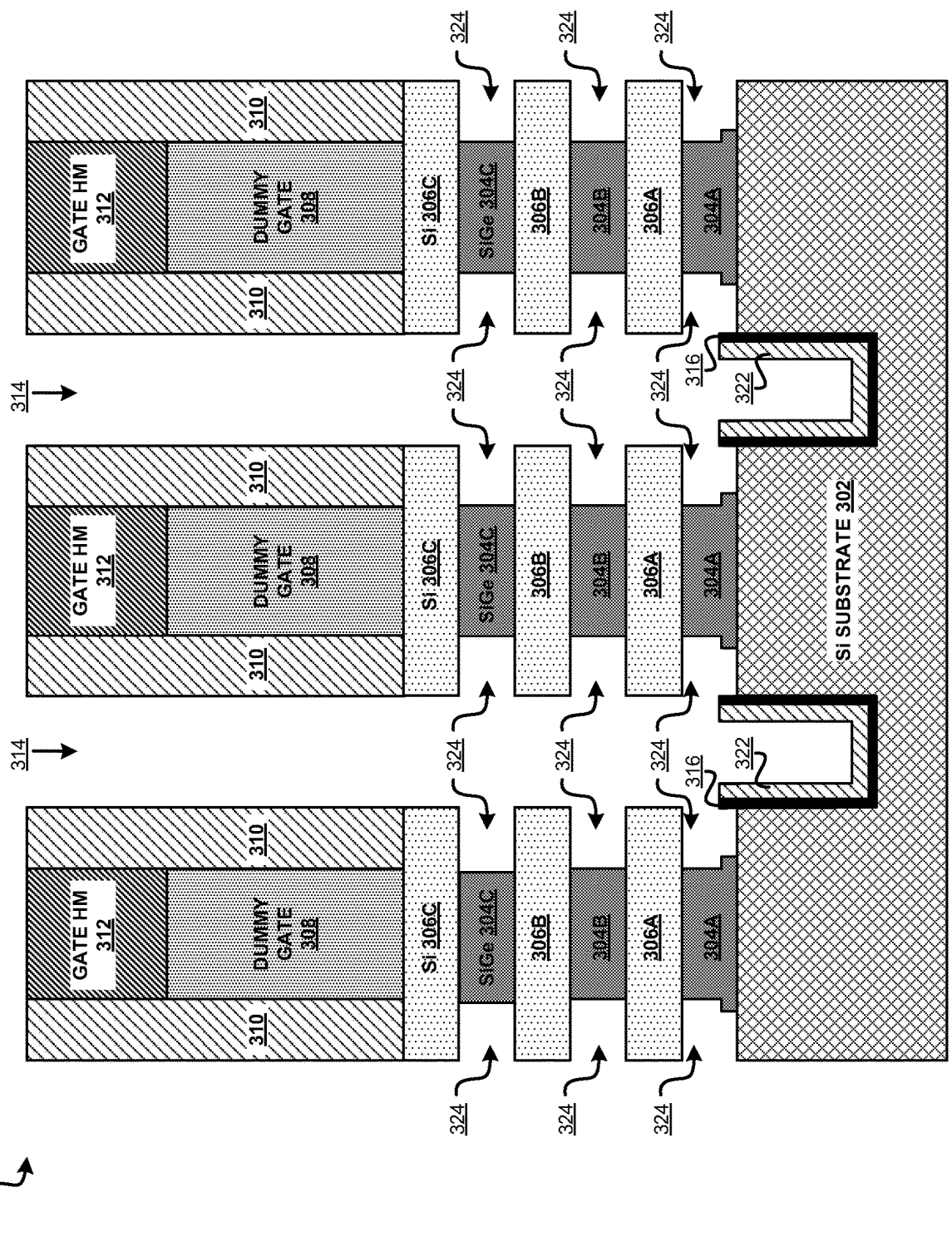
FIG. 8 depicts another portion of a process according to an illustrative embodiment.

With reference to FIG. 8, FIG. 8 depicts another portion of a process in which a structure 800 is formed according to an embodiment. In the embodiment, fabrication system 107 selectively removes portions of first conformal dielectric liner 316 to the level of chamfered portion 322 at the bottom of trench 314. In some embodiments, first dielectric liner 316 is silicon oxide that can be selectively etched by a wet etching process containing hydrofluoric acid. In the embodiment, fabrication system 107 selectively laterally etches edges of each of first SiGe layer 304A, second SiGe layer 304B, and third SiGe layer 304C to create recesses (or indentations) 324 within SiGe layers 304A-304C without substantially affecting Si layers 306A-306C. In one or more embodiments, the depth of recesses 324 within SiGe layers 304A-304C are substantially aligned with the sides of dummy gates 308, respectively. In the embodiment, first SiGe layer 304A is recessed such that a lower portion of first SiGe layer 304A is wider than an upper portion of first SiGe layer 304A. In particular embodiments, recesses 324 are created using a vapor phase (e.g., HCl) or wet etching process.

Figure 9:
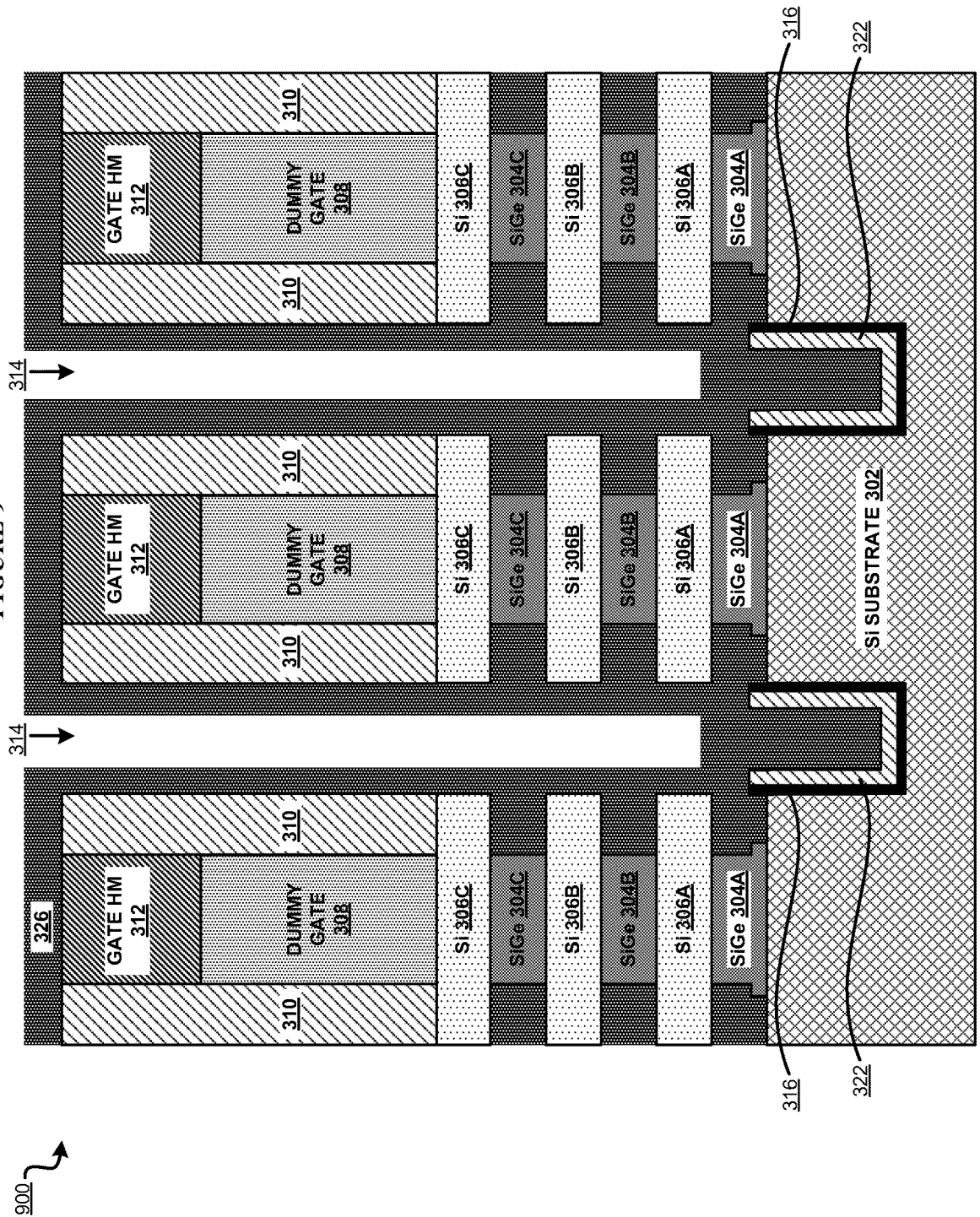
FIG. 9 depicts another portion of a process according to an illustrative embodiment.

With reference to FIG. 9, FIG. 9 depicts another portion of a process in which a structure 900 is formed according to an embodiment. In the embodiment, fabrication system 107 deposits a third conformal dielectric liner 326 upon gate hard mask 312 and trenches 314 to fill recesses 324 and the bottom cavity formed by chamfered portion 322 to fully pinch off the cavity. In a particular embodiment, third conformal dielectric liner 324 is formed of a SiN material.

Figure 10:
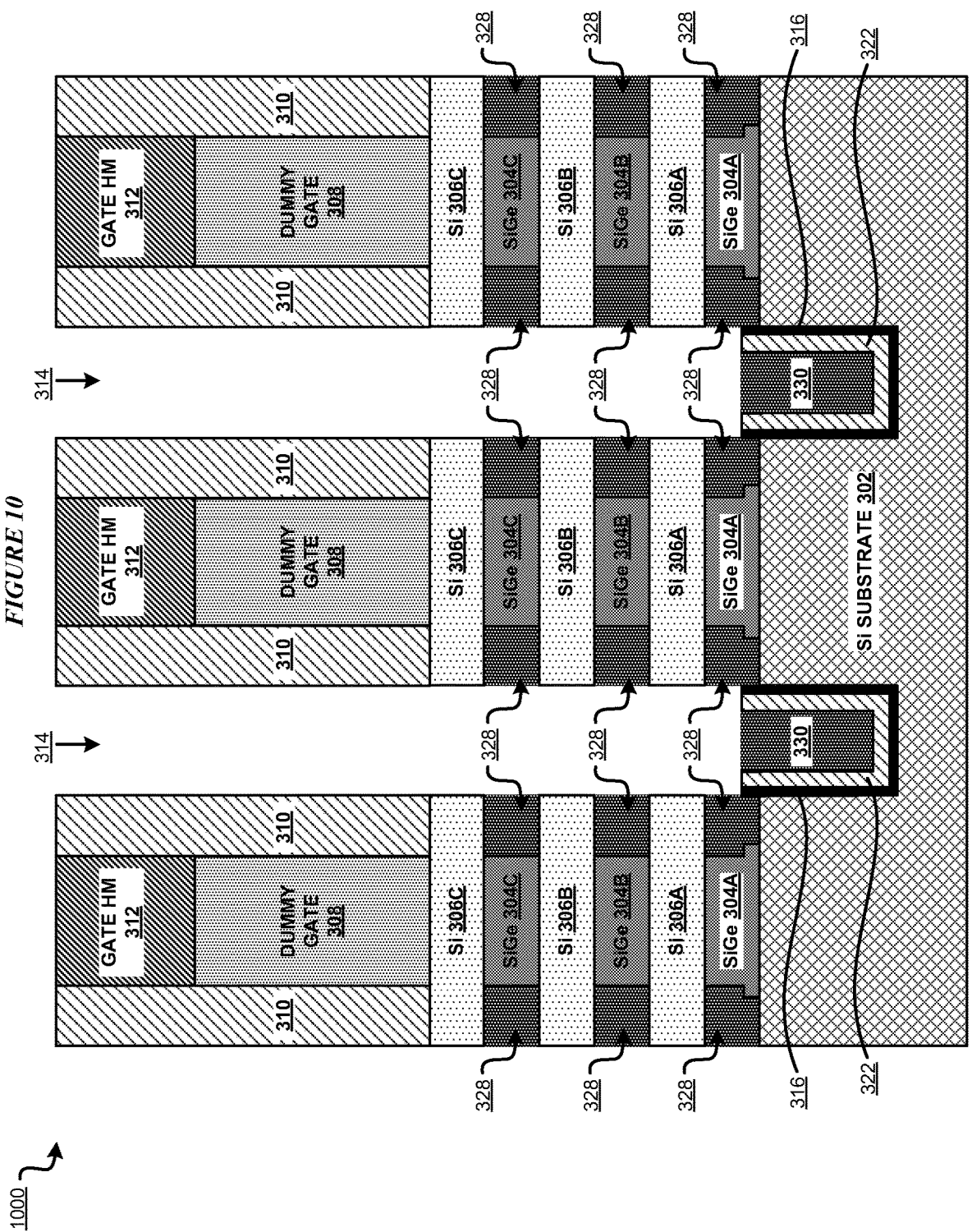
FIG. 10 depicts another portion of a process according to an illustrative embodiment.

With reference to FIG. 10, FIG. 10 depicts another portion of a process in which a structure 1000 is formed according to an embodiment. In one or more embodiments, fabrication system 107 etches back third conformal dielectric liner 326 to form side inner spacer 328 adjacent to SiGe layers 304A-304C, and bottom inner spacers 330 within the cavity to the top level of chamfered portion 322. As a result, inner spacer 330 is isolated from substrate 302 by the portion of first conformal dielectric liner 322 and chamfered portion 322 of second conformal dielectric liner 318.

Figure 11:
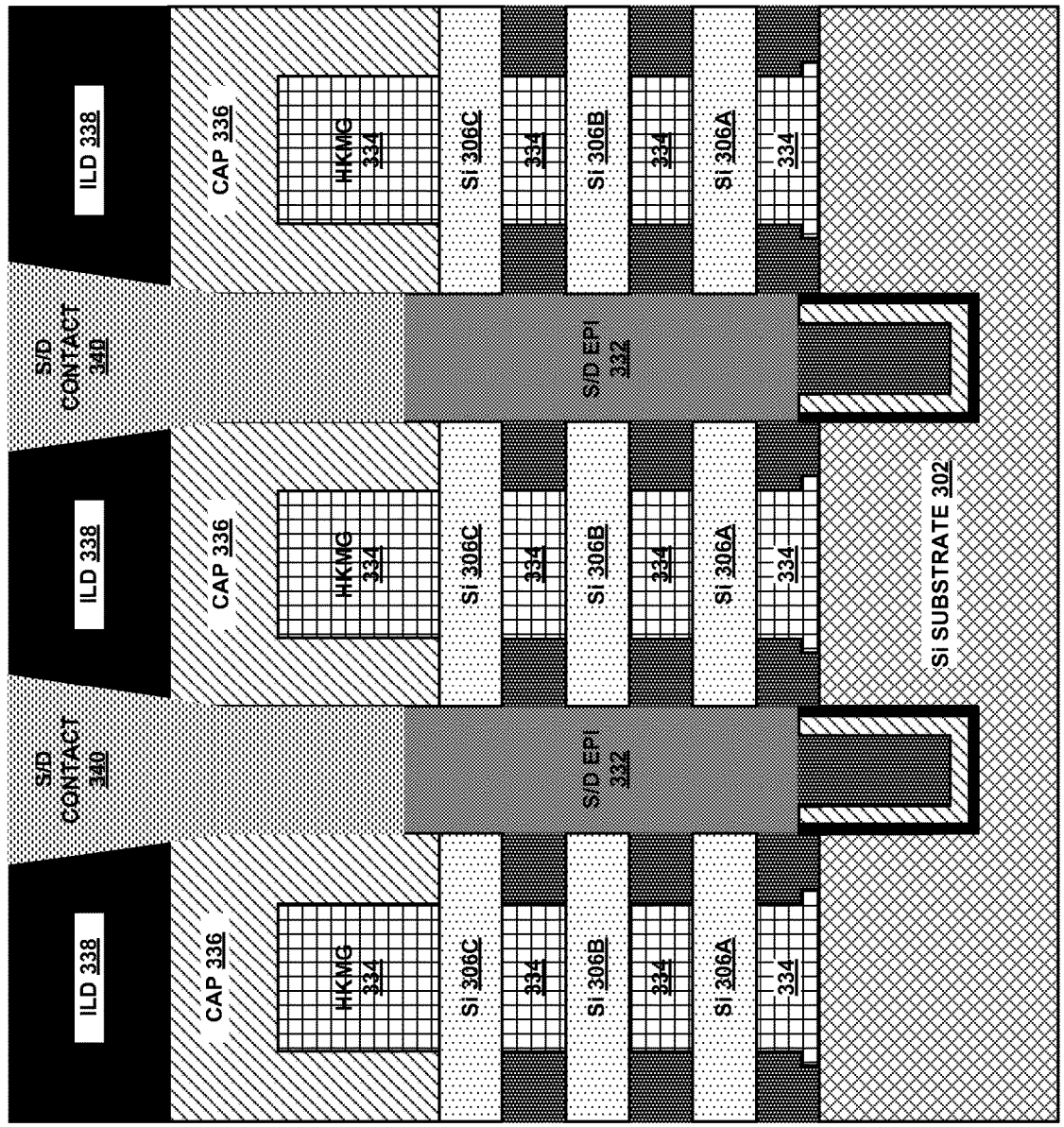
FIG. 11 depicts another portion of a process according to an illustrative embodiment.

With reference to FIG. 11, FIG. 11 depicts another portion of a process in which a structure 1100 is formed according to an embodiment. In the embodiment, fabrication system 107 deposits source/drain (S/D) epitaxy 332 upon ends of silicon nanosheets 306. In some embodiments, source/drain (S/D) epitaxy 332 is formed by epitaxy growth. In particular embodiments, dopants can be incorporated into source/drain (S/D) epitaxy 332 during and/or after epitaxy.

In the embodiment, fabrication system 107 removes the remaining portions of SiGe layers 304A-304C and dummy gates 308, and deposits a gate material 334 such as a high-K metallic gate (HKMG) material or other work function metal (WFM) within the voids left by the removal of SiGe layers 304A-304C and dummy gates 308 to form gates for the nanosheet transistor device. In the embodiment, fabrication system 107 further forms a self-aligned contact (SAC) cap 336 upon the HKMG material 334, and an interlayer dielectric (ILD) layer 338 upon the SAC cap 336. In the embodiment, fabrication system 107 further forms contact trenches within ILD layer 338 and SAC cap 336 to the level of S/D epitaxy 332 and forms S/D contacts within the contact trenches in contact with S/D epitaxy 332. As a result, a nanosheet transistor device with robust source/drain isolation from the substrate is fabricated.

Figure 12:
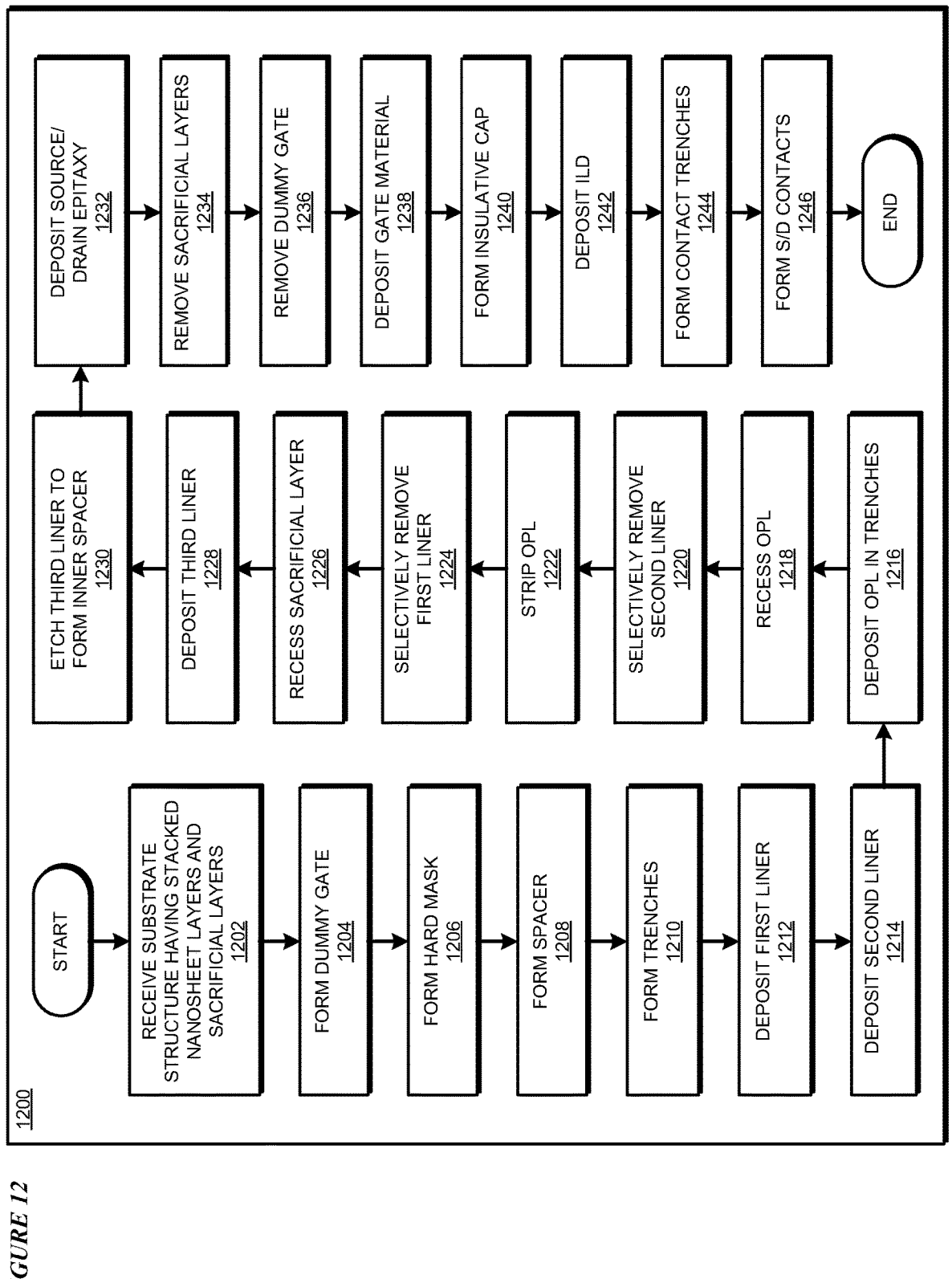
FIG. 12 depicts a flowchart of an example process for fabricating nanosheet transistors in accordance with an illustrative embodiment.

With reference to FIG. 12, FIG. 12 depicts a flowchart of an example process 1200 for fabricating nanosheet transistors in accordance with one or more illustrative embodiments. Process 1200 can be implemented in fabrication system 107 in FIG. 1, to perform one or more steps of FIGS. 3-11 as needed in process 1200.

In block 1202, fabrication system 107 receives a substrate structure having one or more nanosheet layers and one or more sacrificial layers stacked upon a substrate. In a particular embodiment, the substrate structure includes substrate structure 300 having nanosheet layers formed of Si layers 306A-306C and sacrificial layers formed of SiGe layers 304A-304C.

In block 1204, fabrication system 107 forms dummy gates 308 upon the upper nanosheet layer (e.g., third Si layer 306C). In particular embodiments, dummy gates 308 are formed of a silicon nitride (SiN) material. In one or more embodiments, dummy gates 308 are formed by one or more deposition processes.

In block 1206, fabrication system 107 forms a gate hard mask 312 on the tops of dummy gates 308. In block 1208, fabrication system 107 further forms spacer layer 310 around sides of each of dummy gates 308 and gate hard mask 312. In a particular embodiment, spacer layer 310 is formed by a reactive-ion etching (RIE) process. In a particular embodiment, gate hard mask 312 is formed of a siliconborocarbonitride (SiBCN) material.

In block 1210, fabrication system 107 etches through portions of gate hard mask 312, spacer layer 310, third Si layer 306C, third SiGe layer 304C, second Si layer 306B, second SiGe layer 304B, first Si layer 306A, first SiGe layer 304A, and substrate 302 to form vertical trenches 314 adjacent to and between dummy gates 308 thereby forming fins of the substrate structure.

In block 1212, fabrication system 107 deposits a first conformal dielectric liner 316 on gate hard mask 312 and within trenches 314. In one or more embodiments, first conformal dielectric liner 316 is formed of an oxide such as $SiO_2$. In block 1214, fabrication system 107 deposits a second conformal dielectric liner 318 on first conformal dielectric liner 316. In one or more embodiments, second conformal dielectric liner 318 is formed of SiN. In a particular embodiment, first conformal dielectric liner 316 is thinner than second conformal dielectric liner 318.

In block 1216, fabrication system 107 deposits an organic planarizing layer (OPL) 320 within trenches 314. In block 1218, fabrication system 107 recesses OPL 320 to a level below the first nanosheet layer (e.g., Si layer 306A) and between a top surface and bottom surface of the first sacrificial layer (e.g., SiGe layer 304A). In a particular embodiment, fabrication system 107 deposits OPL 320 by a spin coating process, and etches OPL 320 using a controlled wet chemical etch.

In block 1220, fabrication system 107 selectively removes portions of second conformal dielectric liner 318 to form a u-shaped chamfered portion 322 at the bottom of trench 314. In a particular embodiment, fabrication system 107 selectively removes portions of second conformal dielectric liner 318 using a selective wet etching process. In block 1222, fabrication system 107 further strips OPL 320.

In block 1224, fabrication system 107 selectively removes portions of first conformal dielectric liner 316 to a level of a top of u-shaped chamfered portion 322 at the bottom of trench 314. In block 1226, fabrication system 107 selectively laterally etches edges of each of the sacrificial layers (e.g., first SiGe layer 304A, second SiGe layer 304B, and third SiGe layer 304C) to create recesses (or indentations) 324 within the sacrificial layers without substantially affecting the nanosheet layers (e.g., Si layers 306A-306C). In one or more embodiments, the depth of recesses 324 within SiGe layers 304A-304C are substantially aligned with the sides of dummy gates 308, respectively. In the embodiment, first SiGe layer 304A is recessed such that a lower portion of first SiGe layer 304A is wider than an upper portion of first SiGe layer 304A. In particular embodiments, recesses 324 are created using a vapor phase (e.g., HCl) or wet etching process.

In block 1228, fabrication system 107 deposits a third conformal dielectric liner 326 upon gate hard mask 312 and within trenches 314 to fill recesses 324 and the bottom cavity formed by u-shaped chamfered portion 322 to fully pinch off the bottom cavity. In a particular embodiment, third conformal dielectric liner 324 is formed of a SiN material. In block 1230, fabrication system 107 etches back third conformal dielectric liner 326 to form side inner spacers 328 adjacent to SiGe layers 304A-304C, and bottom inner spacer 330 within the cavity to the top level of chamfered portion 322.

In block 1232, fabrication system 107 deposits S/D epitaxy 332 upon bottom inner spacers 330. In block 1234, fabrication system 107 removes the remaining portions of the sacrificial layers. In block 1236, fabrication system 107 removes dummy gates 308. In block 1238, fabrication system 107 and deposits a gate material 334 such as a high-K metallic gate (HKMG) material or other work function metal (WFM) within the voids left by the removal of the sacrificial layers and dummy gates 308 to form gates for the nanosheet transistor device.

In block 1240, fabrication system 107 further forms an insulative cap (e.g., SAC cap 336) upon gate material 334. In block 1242, fabrication system 107 deposits an ILD layer 338 upon the insulative cap. In block 1244, fabrication system 107 further forms contact trenches within ILD layer 338 and SAC cap 336 to the level of S/D epitaxy 332. In block 1246, fabrication system 107 forms S/D contacts within the contact trenches in contact with S/D epitaxy 332. As a result, a nanosheet transistor device with robust source/drain isolation from the substrate is fabricated. Fabrication system 107 ends process 1200 thereafter.

Thus, a computer implemented method, system or apparatus, and computer program product are provided in the illustrative embodiments for fabricating nanosheet transistors in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus, comprising:
a substrate structure having a plurality of nanosheet layers and a plurality of recesses between the nanosheet layers, the substrate structure including at least one trench through portions of the nanosheet layers, the sacrificial layers, and the substrate;
a u-shaped portion formed at a bottom portion of the at least one trench, the u-shaped portion including a bottom cavity;
a first liner disposed upon the u-shaped portion of the at least one trench;
a second liner disposed on the first liner; and
a third liner disposed within the at least one trench to fill the bottom cavity of the u-shaped portion to form a bottom inner spacer within the bottom cavity.

2. The apparatus of claim 1, further comprising:
a plurality of recesses disposed between the nanosheet layers, wherein the third liner is further disposed within the plurality of recesses to form a plurality of inner spacers between the nanosheet layers.

3. The apparatus of claim 1, further comprising:
a source/drain epitaxy disposed upon the bottom inner spacer.

4. The apparatus of claim 1, further comprising:
a gate material disposed between the nanosheet layers.

5. The apparatus of claim 1, further comprising:
an insulative cap disposed upon a top nanosheet of the plurality of nanosheets;
an interlayer dielectric layer disposed upon the insulative cap; and
at least one contact formed within the interlayer dielectric layer and the insulative cap in contact with the source/drain epitaxy.

6. An apparatus, comprising:
a substrate structure having a plurality of nanosheet layers and a plurality of recesses between the nanosheet layers, the substrate structure including at least one trench through portions of the nanosheet layers, the sacrificial layers, and the substrate;
a u-shaped portion formed at a bottom portion of the at least one trench, the u-shaped portion including a bottom cavity;
a first liner disposed upon the u-shaped portion of the at least one trench;
a second liner disposed on the first liner;
a third liner disposed within the at least one trench to fill the bottom cavity of the u-shaped portion to form a bottom inner spacer within the bottom cavity;
a plurality of recesses disposed between the nanosheet layers, wherein the third liner is further disposed within the plurality of recesses to form a plurality of inner spacers between the nanosheet layers;
a source/drain epitaxy disposed upon the bottom inner spacer;
a gate material disposed between the nanosheet layers;
an insulative cap disposed upon a top nanosheet of the plurality of nanosheets;
an interlayer dielectric layer disposed upon the insulative cap; and
at least one contact formed within the interlayer dielectric layer and the insulative cap in contact with the source/drain epitaxy.

* * * * *